United States Patent
Huang et al.

(10) Patent No.: US 8,217,400 B2
(45) Date of Patent: Jul. 10, 2012

(54) POLYCHROMATIC LIGHT EMITTING DIODE DEVICE HAVING WAVELENGTH CONVERSION LAYER MADE OF SEMICONDUCTOR AND METHOD FOR MANUFACTURING THE SAME

(75) Inventors: Shih Cheng Huang, Hsinchu (TW); Po Min Tu, Chiayi County (TW); Ying Chao Yeh, Taipei County (TW); Wen Yu Lin, Taichung County (TW); Peng Yi Wu, Taichung (TW); Shih Hsiung Chan, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 115 days.

(21) Appl. No.: 12/577,350

(22) Filed: Oct. 12, 2009

(65) Prior Publication Data
US 2010/0090232 A1 Apr. 15, 2010

(30) Foreign Application Priority Data
Oct. 13, 2008 (TW) ............... 97139142 A (51) Int. Cl.
H01L 27/15 (2006.01)
H01L 29/26 (2006.01)
H01L 31/12 (2006.01)
H01L 33/00 (2010.01)

(52) U.S. Cl. ......... 257/79; 257/80; 257/89; 438/35

(58) Field of Classification Search ........... 257/E33.061, 257/98, 89, 76, 40, 43, 103, 99; 438/29, 438/26, 458, 46, 47, 455
See application file for complete search history.

(56) References Cited

U.S. PATENT DOCUMENTS

| 6,163,038 A | 12/2000 | Chen et al. |
| 7,042,017 B2 | 5/2006 | Yamada et al. |
| 7,045,375 B1 | 5/2006 | Wu et al. |
| 7,217,959 B2 | 5/2007 | Chen et al. |
| 7,271,417 B2 | 9/2007 | Chen et al. |
| 7,279,716 B2 | 10/2007 | Chen et al. |
| 7,279,717 B2 | 10/2007 | Yamada et al. |
| 7,294,865 B2 | 11/2007 | Chen et al. |
| 7,361,937 B2 | 4/2008 | Chen et al. |
| 2002/0041148 A1 | 4/2002 | Cho et al. |

(Continued)

FOREIGN PATENT DOCUMENTS
CN 1697208 A 11/2005
(Continued)

OTHER PUBLICATIONS

"Monolithic Polychromatic Light-Emitting Diodes Based on InGaN Microfacet Quantum Wells toward Tailor-Made Solid-State Lighting," Applied Physics Express 1 (2008)011106.

"Structural and Optical Properties of In-Rich InAlGaN Heterostructures for White Light Emission," Japanese Journal of Applied Physics, vol. 47, No. 6, 2008, pp. 4413-4416.

(Continued)

Primary Examiner — Ha Tran T Nguyen
Assistant Examiner — Thanh Y Tran
(74) Attorney, Agent, or Firm — Altis Law Group, Inc.

(57) ABSTRACT

A wavelength conversion layer is formed on a surface of a light emitting device for transforming a portion of light emitted from the light emitting device into light of a different wavelength. The transformed light is mixed with the untransformed light, and thus the light emitting device can emit light having preferred CIE coordinates.

9 Claims, 13 Drawing Sheets

U.S. PATENT DOCUMENTS

| | | | |
|---|---|---|---|
| 2006/0043385 A1 | 3/2006 | Wang et al. | |
| 2008/0197373 A1* | 8/2008 | Kim | 257/98 |
| 2008/0217639 A1 | 9/2008 | Kim et al. | |
| 2009/0236619 A1* | 9/2009 | Chakroborty | 257/89 |

FOREIGN PATENT DOCUMENTS

| | | |
|---|---|---|
| TW | 096104378 | 8/2008 |
| TW | 096150701 | 7/2009 |

OTHER PUBLICATIONS

"Phosphor-free white light-emitting diode with laterally distributed multiple quantum wells," Applied Physics Letter 92, 091110 (2008).

"Phosphor-Free GaN-Based Transverse Junction Light Emitting Diodes for the Generation of White Light," IEEE Photoics Technology Letters, vol. 18, No. 24, Dec. 15, 2006.

* cited by examiner

POLYCHROMATIC LIGHT EMITTING DIODE DEVICE HAVING WAVELENGTH CONVERSION LAYER MADE OF SEMICONDUCTOR AND METHOD FOR MANUFACTURING THE SAME

BACKGROUND OF THE INVENTION

1. Field of the Invention

The present invention relates to a light emitting diode device and manufacturing method thereof, and more particularly to a polychromatic light emitting diode device and manufacturing method thereof.

2. Description of the Related Art

Commercialized white light emitting diode devices, built using the present light emitting technology, produce white light by mixing of red, green and blue light, which are separately emitted from red, green and blue light emitting diodes. However, the method has a disadvantage of poor mixture quality. When white light emitting diode devices are used in a backlight source of a liquid crystal display, a diffusion plate and a brightness enhancement film can be utilized to enhance uniformity of mixing light. On the contrary, when the white light emitting devices are used for lighting, uniformly mixing light cannot be easily obtained. Moreover, the lifespan of red, green and blue light emitting diodes are different, and if any one fails, the color of light would become obviously imbalanced and harsh to users' eyes.

The current mainstream method uses light emitting diodes with phosphorus powders to mix white light. For example, blue light emitted from nitride based semiconductor light emitting diodes can be mixed with yellow light emitted from an excited yellow phosphorus powder to generate white light. However, the method has a disadvantage of the short lifespan of a yellow phosphorus powder, and especially, the yellow phosphorus powder is disposed so close to the light emitting diodes with high temperature such that its light conversion efficiency decreases beyond expectations. Moreover, phosphorus powders have an issue of low light conversion efficiency. However, the using an inorganic phosphorus powder for its longer lifespan would obtain light conversion efficiency that is lower than those of organic phosphorus powders. Therefore, various researches have been carried out to develop white light emitting diodes without using phosphor powers or to develop polychromatic light emitting diodes.

A paper titled "*Monolithic Polychromatic Light-Emitting Diodes Based on InGaN Microfacet Quantum Wells toward Tailor-Made Solid-State Lighting*," Applied Physics Express 1 (2008)011106, discloses a method that uses silicon oxide stripes as a mask and epitaxially grows microstructured InGaN/GaN quantum wells on unmasked areas. Due to the alteration of growth conditions and mask geometry can be changed to emit various wavelengths, light of various wavelengths can be mixed to generate white light. A paper titled "*Structural and Optical Properties of In-Rich InAlGaN Heterostructures for White Light Emission*," Japanese Journal of Applied Physics, Vol. 47, No. 6, 2008, p.p. 4413-4416, discloses a method that trimethylaluminium flow rate and reactor pressure are adjusted to form three-dimensional island structures during a metal organic chemical vapor deposition process on a InGaN layer. Due to low surface mobility of aluminum atoms separate to in-rich phase, a broad emission from green to red wavelengths can be observed. Combining blue emission from InGaN layer with green to red emission from In-rich InAlGaN alloy layer, white light emission has been obtained.

A paper titled "*Phosphor-free white light-emitting diode with laterally distributed multiple quantum wells*," APPLIED PHYSICS LETTER 92, 091110 (2008), relates to a method that a portion of structure of blue InGaN multiple quantum wells is etched away, and green InGaN multiple quantum wells are epitaxially grown on the etched portion. Thus, the final structure can emit blue and green light. Another method, which is used to produce a multiple quantum well structure including different single quantum well layers each emitting corresponding blue or green light, is disclosed in a paper titled "*Phosphor-Free GaN-Based Transverse Junction Light Emitting Diodes for the Generation of White Light*," IEEE PHOTOICS TECHNOLOGY LETTERS, VOL. 18, NO. 24, Dec. 15, 2006, U.S. Pat. Nos. 7,279,717, 7,042,017, 6,163,038, 7,361,937, 7,294,865, 7,279,716, and U.S. Patent Publication No. 2006/0,043,385, wherein U.S. Pat. No. 7,279,716 teaches using red phosphor to generate white light.

Moreover, several other methods are developed, and those includes a method, disclosed in U.S. Pat. No. 7,217,959, using a blue light emitting layer composed of quantum dots formed on an active layer emitting blue light; a method, disclosed in U.S. Pat. No. 7,271,417, of epitaxially forming a porous light-emitting layer, which can emit light with a plurality of wavelengths; and a method, disclosed in U.S. Patent Publication No. 2002/0,041,148, of epitaxially forming III-V semiconductor layer and II-V semiconductor layer to stack together, and emitting different wavelengths from them to mix a white light.

In all above exemplary prior arts, light emitting material emitting a second wavelength light is disposed between an n-type conductive layer and a p-type conductive layer; however, such a configuration may easily change the profile of a p-n junction, further affecting the light emission or electrical characteristics of the light emitting diode. In addition, some prior arts still need phosphor; however, red phosphor has low light conversion efficiency. Moreover, some prior arts need lithography and etching processes between two epitaxial growth processes, and the process steps are complex and may result in low yield.

SUMMARY OF THE INVENTION

In view of the above description in Description of the Related Art and to meet industrial requirements, the invention provides a polychromatic light emitting diode device, on which at least a wavelength conversion layer is disposed, wherein the wavelength conversion layer is a semiconductor layer.

One objective of the present invention provides a light emitting diode device, which can be adapted to fit in any range on the CIE chromaticity diagram.

Another objective of the present invention provides a white light source having good color rendering index (Ra).

BRIEF DESCRIPTION OF THE DRAWINGS

The invention will be described according to the appended drawings in which.

DETAILED DESCRIPTION OF THE INVENTION

One aspect of the present invention suggests a light emitting device and fabrication method thereof. In order to thoroughly understand the present invention, detailed descriptions of method steps and components are provided below. Clearly, the implementations of the present invention are not limited to the specific details that are familiar to persons in the art related to a light emitting device and fabrication method thereof. On the other hand, components or method steps, which are well known, are not described in detail. A preferred embodiment of the present invention will be described in detail as follows. However, except the preferred detailed description, other embodiments can be broadly employed, and the scope of the present invention is not limited by any of the embodiments, but should be defined in accordance with the following claims and their equivalent.

The present invention utilizes at least one wavelength conversion layer formed on a surface of a light emitting device for the transformation of a portion of light emitted from the light emitting device into light of a different wavelength, which is mixed with the untransformed light to emit light having preferred CIE coordinates.

The present invention provides a polychromatic light emitting diode device comprising a substrate, a multiple semiconductor layer formed on the substrate, and a first wavelength conversion layer formed on the multiple semiconductor layer. The multiple semiconductor layer comprises an n-type semiconductor layer, a p-type semiconductor layer and an active layer disposed between the n-type semiconductor layer and the p-type semiconductor layer, wherein the active layer emits a first wavelength. The first wavelength conversion layer absorbs a portion of the first wavelength emitted from the active layer and emits a second wavelength, wherein the second wavelength is longer than the first wavelength.

The present invention provides a method for manufacturing a polychromatic light emitting diode device. The method first provides an epitaxial substrate. Next, a multiple semiconductor layer is formed on the epitaxial substrate. Finally, a first wavelength conversion layer is formed on the multiple semiconductor layer. An n-type semiconductor layer, a p-type semiconductor layer and an active layer disposed between the n-type semiconductor layer and the p-type semiconductor layer, and the active layer emits a first wavelength. The first wavelength conversion layer absorbs a portion of the light of a first wavelength emitted from the active layer and emits a second wavelength, wherein the second wavelength is longer than the first wavelength.

The material of the first wavelength conversion layer is a Group III-V semiconductor material or a Group II-VI semiconductor material. The Group III-V semiconductor material is Group III nitride, Group III phosphide or Group III arsenide. Moreover, the surface of the first wavelength conversion layer can be a rough surface.

The present invention simultaneously comprises a second wavelength conversion layer formed on the first wavelength transformation layer, wherein the second wavelength conversion layer absorbs the first wavelength and the second wavelength from the first wavelength conversion layer to emit a third wavelength, and the third wavelength is longer than the second wavelength. The material of the second wavelength conversion layer is Group III nitride, Group III phosphide or Group III arsenide.

The Group II-VI semiconductor material is Group II oxide, Group II sulfide or Group II selenide.

The epitaxial substrate is of sapphire ($Al_2O_3$), silicon carbide (SiC), lithium aluminate ($AlLiO_2$), lithium gallate ($LiGaO_2$), silicon (Si), gallium nitride (GaN), zinc oxide (ZnO), aluminum zinc oxide (AlZnO), gallium arsenide (GaAs), gallium phosphide (GaP), gallium antimonide (GaSb), indium phosphide (InP), indium arsenide (InAs), zinc selenide (ZnSe) or metal. The present invention further comprises a buffer layer between the epitaxial substrate and the multiple semiconductor layer. The present invention further comprises a p-type electron blocking layer disposed between the active layer and the p-type semiconductor layer. In addition, the present invention further comprises a transparent conductive layer, which is formed on the first wavelength conversion layer or the second wavelength transformation layer, and is in ohmic contact with the first wavelength conversion layer or the second wavelength transformation layer.

The epitaxial substrate can be of sapphire ($Al_2O_3$), silicon carbide (SiC), lithium aluminate ($AlLiO_2$), lithium gallate ($LiGaO_2$), silicon (Si), gallium nitride (GaN), zinc oxide (ZnO), aluminum zinc oxide (AlZnO), gallium arsenide (GaAs), gallium phosphide (GaP), gallium antimonide (GaSb), indium phosphide (InP), indium arsenide (InAs), or zinc selenide (ZnSe). The present invention comprises a buffer layer formed between the epitaxial substrate and the multiple semiconductor layer. The present invention further comprises a p-type electron blocking layer disposed between the active layer and the p-type semiconductor layer. In addition, the present invention moreover comprises a transparent conductive layer, which is formed on the first wavelength conversion layer and is in ohmic contact with the first wavelength transformation layer.

The present invention additionally comprises an ohmic contact layer formed on the first wavelength transformation layer, wherein the ohmic contact layer is in ohmic contact with the first wavelength transformation layer. The present invention further comprises a metal substrate formed on the ohmic contact layer. The present invention, as well as, comprises a step of removing the epitaxial substrate.

To better understand the above-described objectives, characteristics and advantages of the present invention, embodiments, with reference to the drawings, are provided for detailed explanations.

Figure 1:
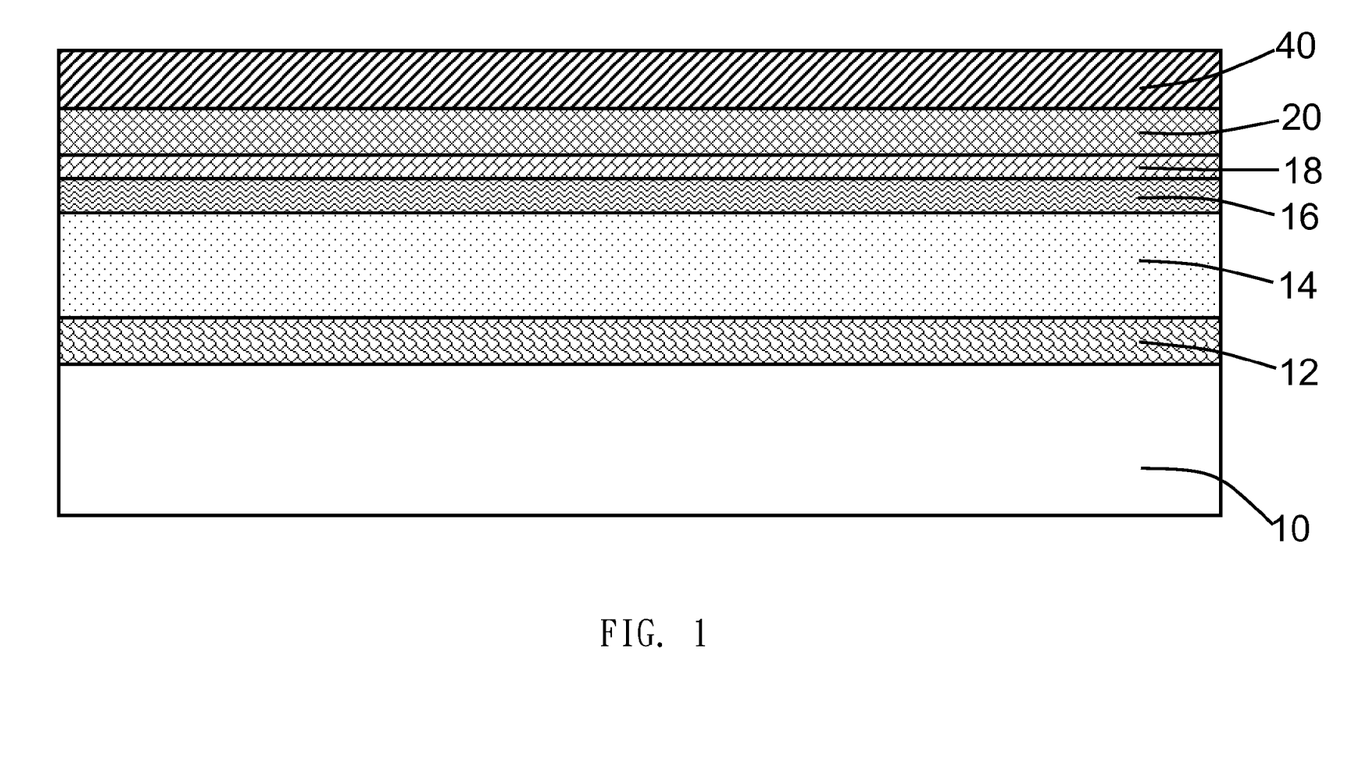
FIG. 1 is a structure showing a light emitting diode device with a wavelength conversion layer according to one embodiment of the present invention.

Referring to FIG. 1, an epitaxial substrate 10 is first provided, wherein the following types of substrates can be used as the epitaxial substrate 10: a sapphire substrate, a silicon carbide substrate, a lithium aluminate substrate, a lithium gallate substrate, a silicon substrate, a gallium nitride substrate, a zinc oxide substrate, an aluminum zinc oxide substrate, a gallium arsenide substrate, a gallium phosphide substrate, a gallium antimonide substrate, an indium phosphide substrate, an indium arsenide substrate, or a zinc selenide substrate. The selection of an epitaxial substrate depends on the material of an epitaxially formed layer. For example, Group II-V semiconductor may be formed on a zinc selenide substrate or a zinc oxide substrate; Group III arsenide or Group III phosphide usually is formed on a gallium arsenide substrate, a gallium phosphide substrate, an indium phosphide substrate, or an indium arsenide substrate; and Group III nitride is commercially formed on a sapphire substrate or a silicon carbide substrate, while Group III nitride is experimentally formed on a lithium aluminate substrate, a lithium gallate substrate, a silicon substrate, or an aluminum zinc oxide substrate. Furthermore, lattice structure and lattice constant are important basis to choose a substrate type. If the difference of lattice constants is too large, a buffer layer is required to obtain good quality of an epitaxial layer. In the present invention, the epitaxial material is Group III nitride, especially gallium nitride, and is used with a sapphire substrate or a silicon carbide substrate. However, persons skilled in the art can understand the epitaxial material is not limited to Group III nitride, or even gallium nitride. Any Group III-V semiconductor or Group II-VI semiconductor can apply in the present invention.

A method of improving the quality of an epitaxial layer is initially to form a pattern on an epitaxial substrate 10 so that defects would not grow following the growth direction of an epitaxial layer and finally to an active layer. The design of patterns depends on eptiaxial conditions and quality. Relevant information can be found in TW Patent Application No. 096150701.

Due to the use of a sapphire substrate or a silicon carbide substrate, a buffer layer 12 is formed before epitaxial deposition of Group III nitride. That is because the lattice mismatch between a sapphire substrate and gallium nitride is up to 14%. Similarly, the lattice mismatch between a silicon carbide and gallium nitride is about 3.5%. Generally, the material of the buffer layer 12 can be gallium nitride, aluminum gallium nitride, aluminum nitride or InGaN/InGaN super lattice structure. The method for forming InGaN/InGaN super lattice structure is disclosed in TW Patent Application No. 096104378. The buffer layer 12 is formed in an expitaxy equipment such as a metal organic chemical vapor deposition equipment or a molecular beam epitaxy equipment. The temperature of formation of the buffer layer 12 is lower than that of formation of the following expitaxial layer. For example, the epitaxial temperature of InGaAlN is between about 800 and 1400 degrees Celsius, while the epitaxial temperature of the buffer layer 12 is between about 250 and 700 degrees Celsius. If a metal organic chemical vapor deposition equipment is used, the precursor for nitrogen can be ammonia or nitrogen, the precursor for gallium can be trimethylgallium or triethylgallium, and the precursor for aluminum can be the trimethylaluminum or triethylaluminum. The reactor can be at atmospheric pressure or low pressure.

Next, n-type gallium nitride layer or aluminum gallium nitride layer is formed for providing a light emitting diode an n-type cladding layer 14. The n-type gallium nitride layer or the n-type aluminum gallium nitride layer is formed in a metal organic chemical vapor deposition equipment or a molecular beam epitaxy equipment. During formation of the nitride layer, a Group IV element is simultaneously doped. In the present embodiment, the element is silicon, and the precursor for silicon used in a metal organic chemical vapor deposition equipment can be silane or disilane. Between the n-type cladding layer 14 and the buffer layer 12, an undoped gallium nitride layer (not shown) and an n-type contact layer (not shown) can sequentially formed, and these two layers are optional. The undoped gallium nitride layer is for improving the quality of the n-type cladding layer 14, and the n-type contact layer, wherein the n-type contact layer is a heavily doped gallium nitride layer or a heavily doped aluminum gallium nitride layer, is for providing better electrical conductivity between n-type electrodes.

Then, an active layer 16 is formed on the n-type cladding layer 14, wherein the active layer 16 is the light emitting layer of a light emitting diode device, being able to have a heterogeneous structure, a double heterogeneous structure, single quantum well structure or multiple quantum well structure. The multiple quantum well structure is presently adopted, including a multiple quantum well layer and a barrier layer. The quantum well layer can be of indium gallium nitride, and the barrier layer can be of a ternary compound such as aluminum gallium nitride. In addition, a quaternary compound such as $Al_xIn_yGa_{1-x-y}N$ can be used as the quantum well layer and the barrier layer, wherein changing the ratios of aluminum and gallium can separately obtain a barrier layer having high band gap energy and a quantum well layer having low band gap energy. The formation of the active layer 16 is similar to the above-mentioned n-type cladding layer 14, wherein the precursor for indium can be trimethylindium or triethylindium. The active layer 16 can be doped with an n-type dopant or a p-type dopant, can be doped with n-type and p-type dopants, or is not doped. Moreover, the quantum well layer can be doped, but the barrier layer is not; the quantum well layer is not doped, but the barrier layer is doped; or both quantum well layer and barrier layer are not doped. Furthermore, a portion of the quantum well can be of delta doping.

Next, a p-type electron blocking layer 18 is formed on the active layer 16, and this step is optional. The p-type electron blocking layer 18 may include a first Group III-V semiconductor layer and a second Group III-V semiconductor layer, which have different energy band gaps and are deposited on the active layer 16 in a periodically repeating manner to form a electron blocking layer with energy barrier higher than that of the active layer 16 for blocking electrons overflowing out of the active layer 16. The detailed descriptions and the manufacturing method of the p-type electron blocking layer 18 can refer to TW Patent Application No. 097128065.

Next, a p-type gallium nitride layer or aluminum gallium nitride layer is formed for providing the light emitting diode a p-type cladding layer 20. The p-type gallium nitride or the p-type aluminum gallium nitride layer is formed in a metal organic chemical vapor deposition equipment or a molecular beam epitaxy equipment. During the formation of the nitride layer, a Group II element is simultaneously doped. In the present embodiment, the element is magnesium, and the precursor for magnesium used in a metal organic chemical vapor deposition equipment can be $CP_2Mg$. On the nitride layer 20, a p-type contact layer (not shown), which is optional, can be formed. The p-type contact layer can be a heavily-doped gallium nitride layer or a heavily-doped aluminum gallium nitride layer, which is for providing better electrical conductivity between p-type electrodes.

Then, a wavelength conversion layer 40 is formed on the p-type cladding layer 20 or the p-type contact layer. The material of the wavelength conversion layer 40 can be a Group III-V semiconductor material or a Group II-VI semiconductor material such as AlInGaAs, GaAs, InAs, AlAs, InGaAs, AlGaAs, InAlAs, AlInGaP, GaP, InP, AlP, InGaP, AlGaP, InAlP, AlInGaN, GaN, InN, AlN, InGaN, AlGaN, InAlN, ZnSe, ZnMgBeSSe, ZnCdSe, ZnMgSe, ZnSSe, ZrAgSSe, ZnMgSSe, ZnCdSe/ZnMgSSe or ZnMgBeSe/ZnCdSe/ZnMgBeSe. The wavelength conversion layer 40, which is of a Group III-V semiconductor material or a Group II-VI semiconductor material, can be formed using a metal organic chemical vapor deposition process, a molecular beam epitaxy process, or a wafer bonding process, wherein the wafer bonding process directly bonds a formed wavelength conversion layer onto a p-type cladding layer or a p-type contact layer. In the present embodiment, the wavelength conversion layer can be doped to be p-type so as to reduce the electrical resistance.

In the active layer of a light emitting diode, the combination of electrons and holes produces a first wavelength. A portion of the first wavelength excites the wavelength conversion layer so that a second wavelength emits. To adjust the energy levels of the active layer and the wavelength conversion layer can make the light emitting diode fit in any range on the CIE chromaticity diagram or provide white light having good color rendering index (Ra).

In the present invention, the wavelength transformation structure can be one or more layers, and multiple wavelength transformation layers can be a combination of different materials. For example, in a two-layer situation, one wavelength conversion layer can be Group III-V semiconductor and another can be Group II-VI semiconductor, or both layers can be either Group III-V semiconductor or Group II-VI semiconductor. Moreover, the surface of the wavelength conversion layer can be a rough surface.

Figure 7:
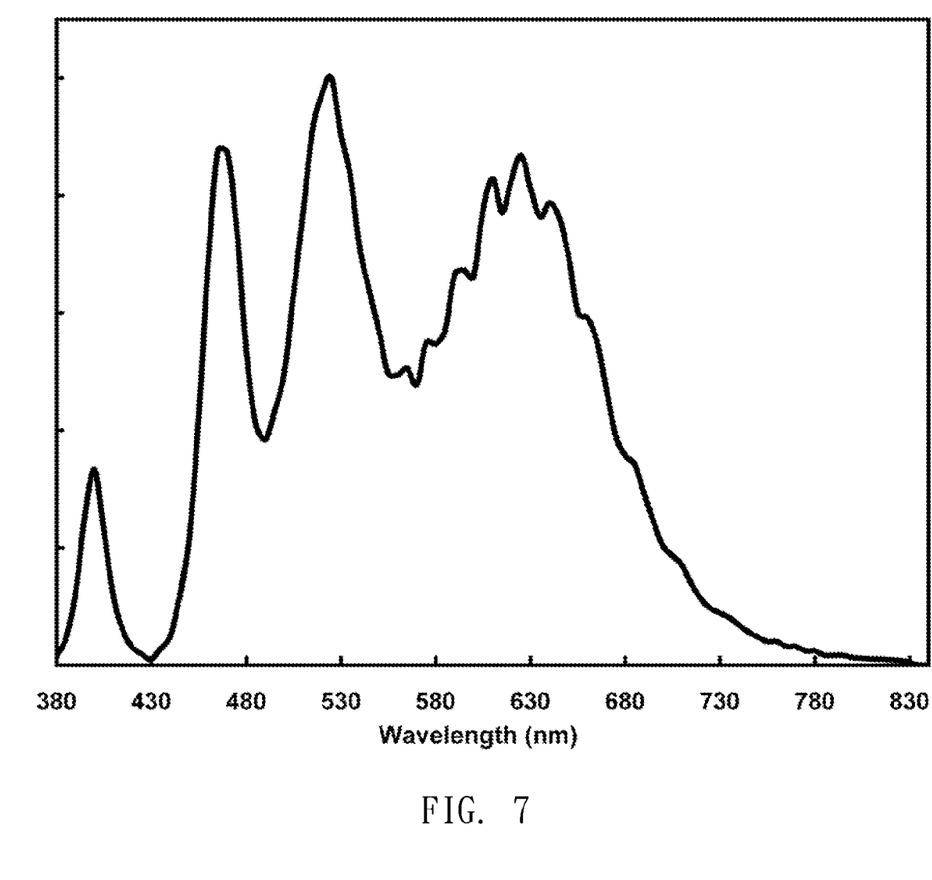
FIG. 7 is a spectrum diagram showing a mixture of light from an ultraviolet light layer and light from three wavelength transformation layers according to one embodiment of the present invention.

In one embodiment of the present invention, the active layer is InGaN/AlGaN multiple quantum well layer, which emits ultraviolet or near ultraviolet light having a wavelength in a range of 365 to 420 nanometers, as shown in FIG. 7. The wavelength transformation structure can have three layers: a first wavelength transformation layer, which is of InGaN and emits blue light with a wavelength in a range of 400 to 480 nanometers; a second wavelength transformation layer, which is of InGaN and emits green or yellow-green light with a wavelength in a range of 480 to 570 nanometers; and a third wavelength transformation layer, which is of GaP, GaAs, or InN and can emit yellow or red light with a wavelength in a range of 580 to 650 nanometers.

Figure 8:
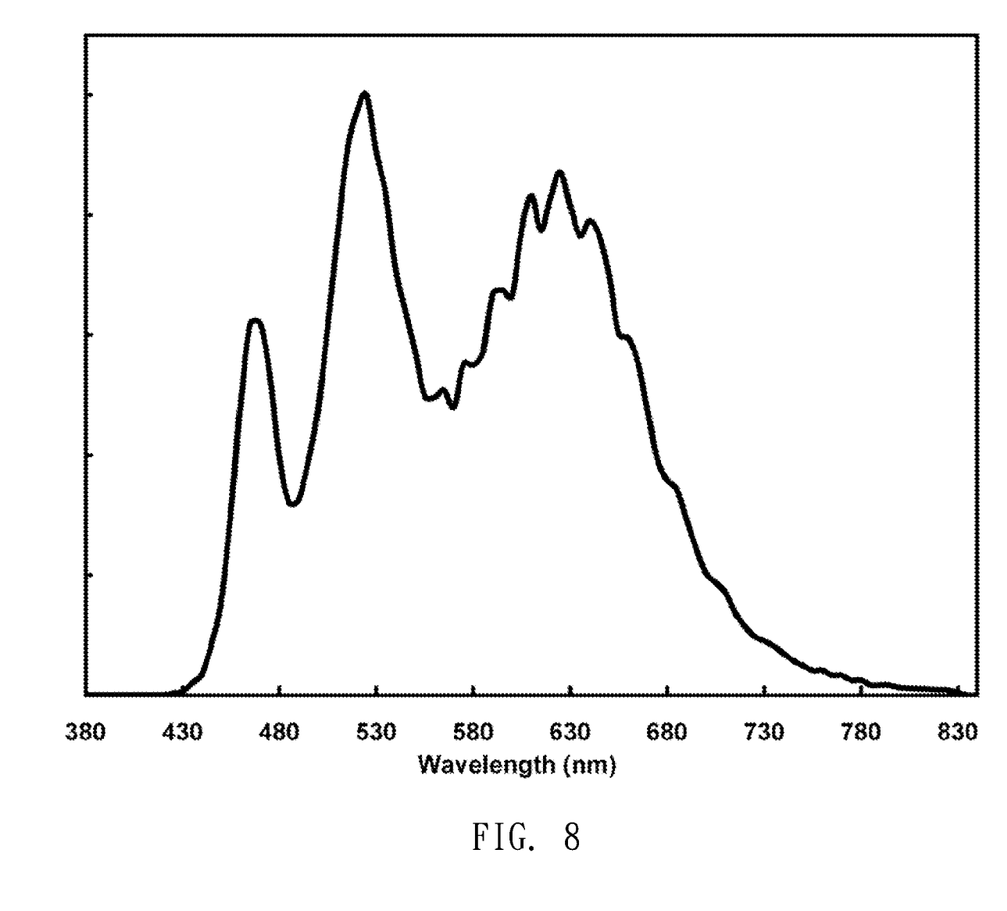
FIG. 8 is a spectrum diagram showing a mixture of light from a blue light layer and light from two wavelength transformation layers according to one embodiment of the present invention.

In another embodiment of the present invention, the active layer is an InGaN/AlGaN multiple quantum well layer that can emit blue light with a wavelength in a range of 440 to 460 nanometers, as shown in FIG. 8. The wavelength transformation structure can have two layers: a first wavelength transformation layer, which is of InGaN and emits green or yellow-green light with a wavelength in a range of 480 to 570 nanometers; and a second wavelength transformation layer, which is of GaP, GaAs, or InN and can emit yellow or red light with a wavelength in a range of 580 to 650 nanometers.

Figure 9:
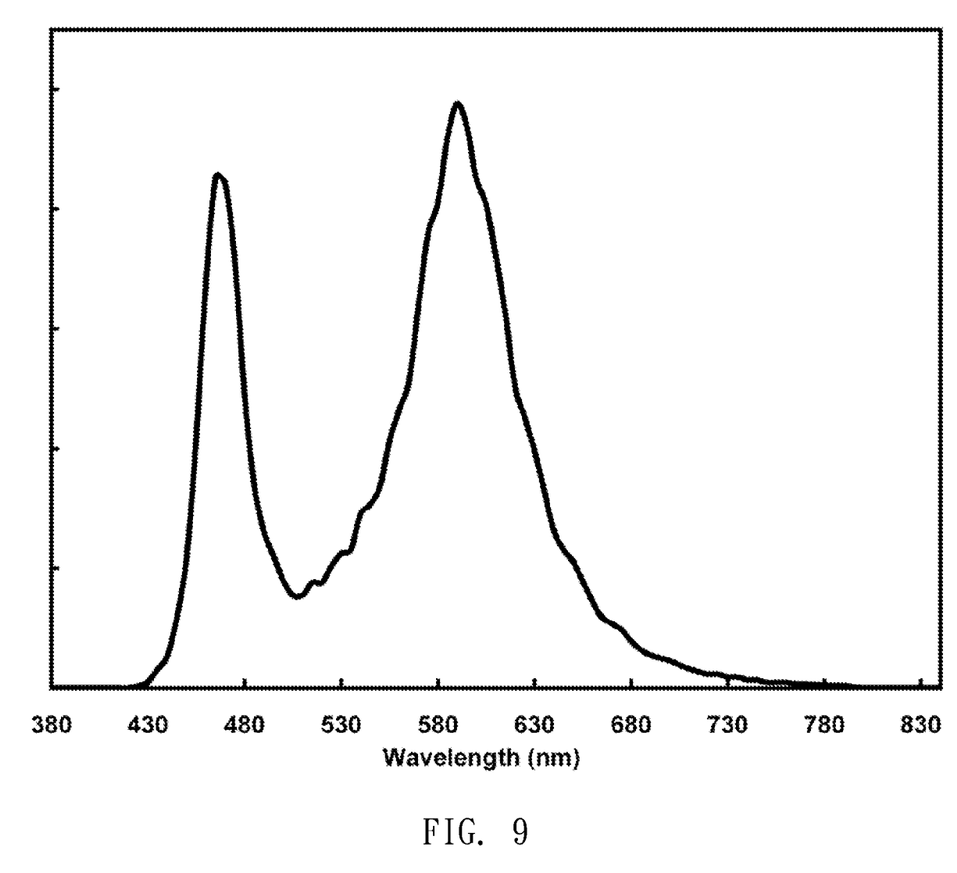
FIG. 9 is a spectrum diagram showing a mixture of light from a blue light layer and light from one wavelength conversion layer according to one embodiment of the present invention.

In the other embodiment of the present invention, the active layer is an InGaN/AlGaN multiple quantum well layer that can emit blue light with a wavelength in a range of 440 to 460 nanometers, as shown in FIG. 9. The wavelength transformation structure can have a wavelength transformation layer, which is of GaP, GaAs, or InN and can emit yellow or red light with a wavelength in a range of 520 to 650 nanometers. In the above embodiments, yellow or green phosphors can be added in the final packaging step so that a packaged light emitting diode can emit white light having good color rendering index.

Figure 2:
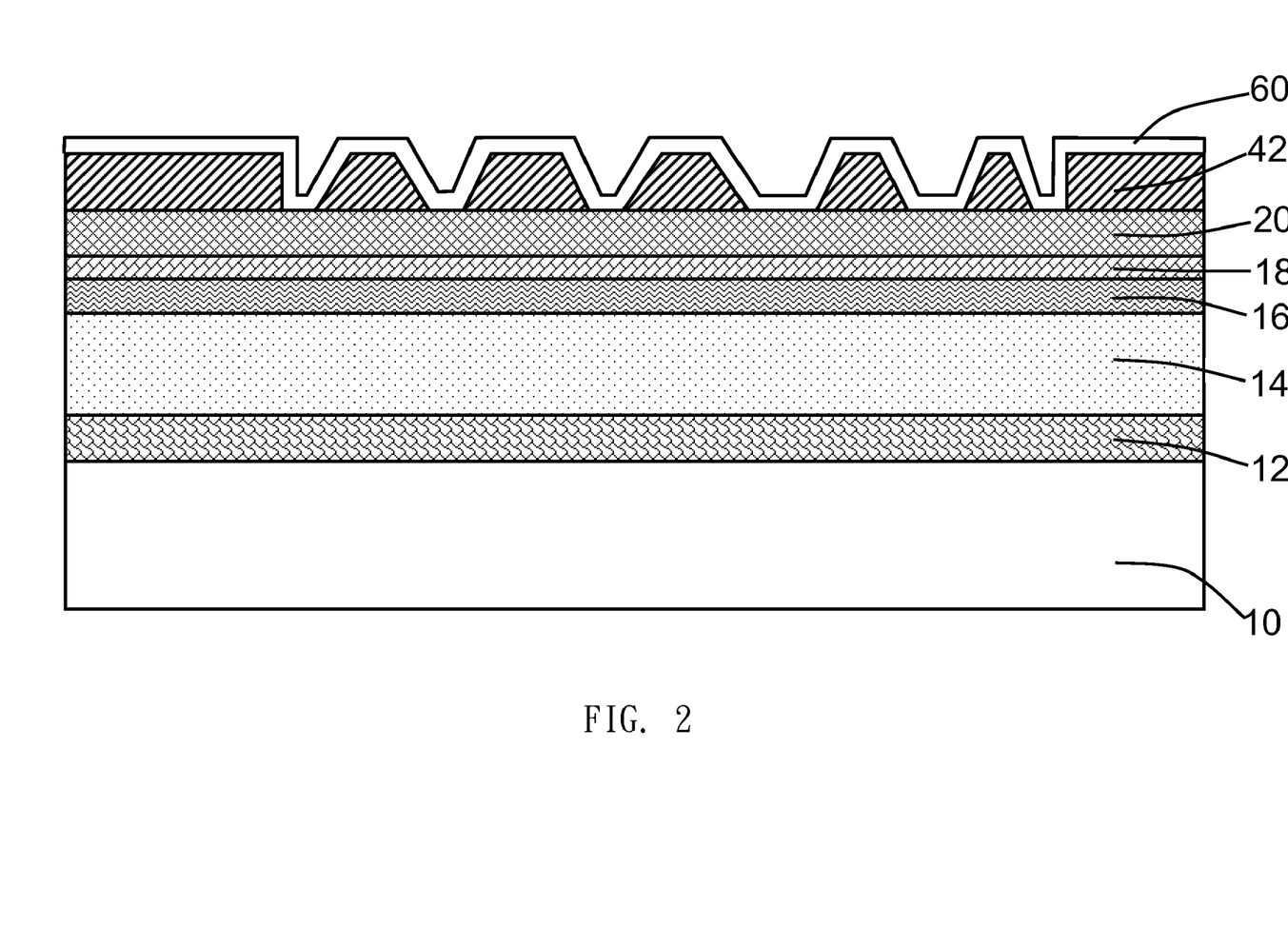
FIG. 2 is a rough surface formed on a wavelength conversion layer according to one embodiment of the present invention.

Referring to FIG. 2, if the material of the wavelength conversion layer 42 is insulative, the transparent conductive layer 60 should be electrically connected to either the p-type cladding layer 20 or the p-type contact layer. The simplest method to accomplish the electrical connection is that a portion of the wavelength conversion layer 42 is removed using an etching process or a partially covered wavelength conversion layer 42 is directly formed by the manipulation of epitaxial process conditions. The etching process can be a dry etching process or a wet etching process.

Figure 3A:
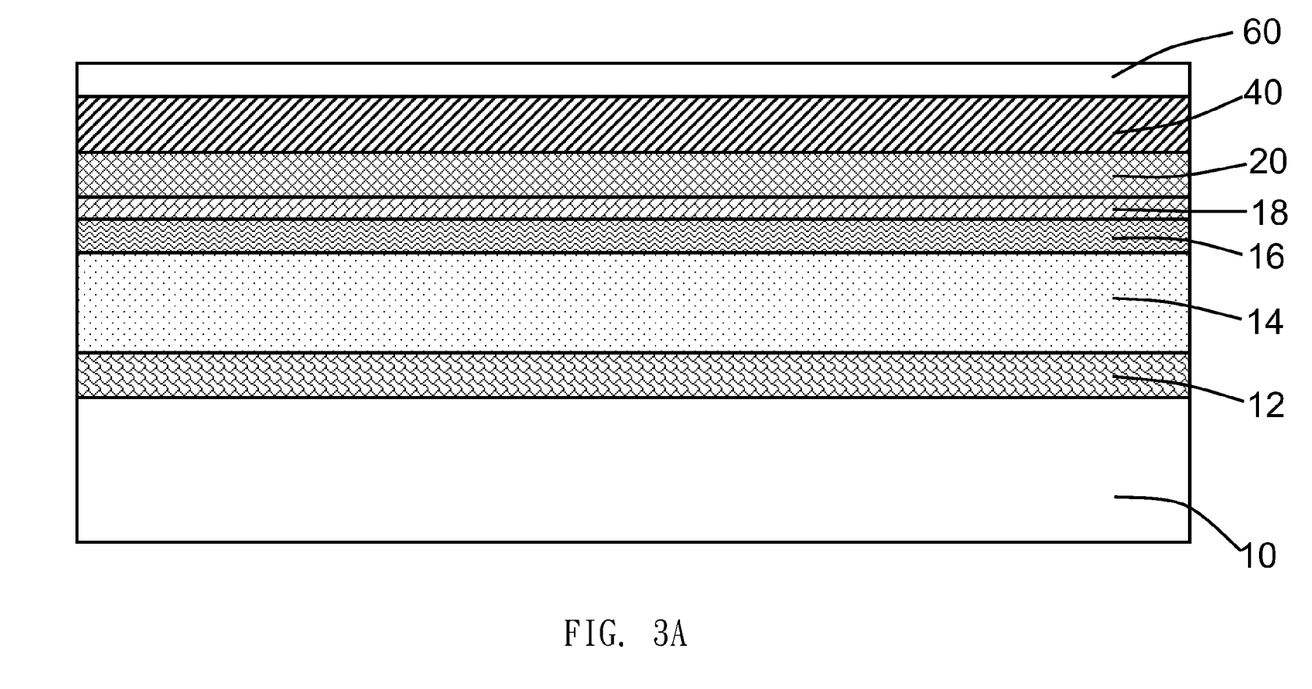
FIG. 3A is a transparent conductive layer formed during chip dicing process according to one embodiment of the present invention.

The following steps are related to a die-dicing process for a light emitting diode. As shown in FIG. 3A, a transparent conductive layer 60 is formed on the wavelength conversion layer 40, wherein the transparent conductive layer 60 can be in ohmic contact with the wavelength conversion layer 40. The material of the transparent conductive layer 60 can be a material, which can be in ohmic contact with Group III nitride, such as Ni/Au, ITO, IZO, IWO or IGO, etc. The transparent conductive layer can be formed using physical vapor deposition process such as a vapor deposition process or a sputter deposition process.

Figure 3B:
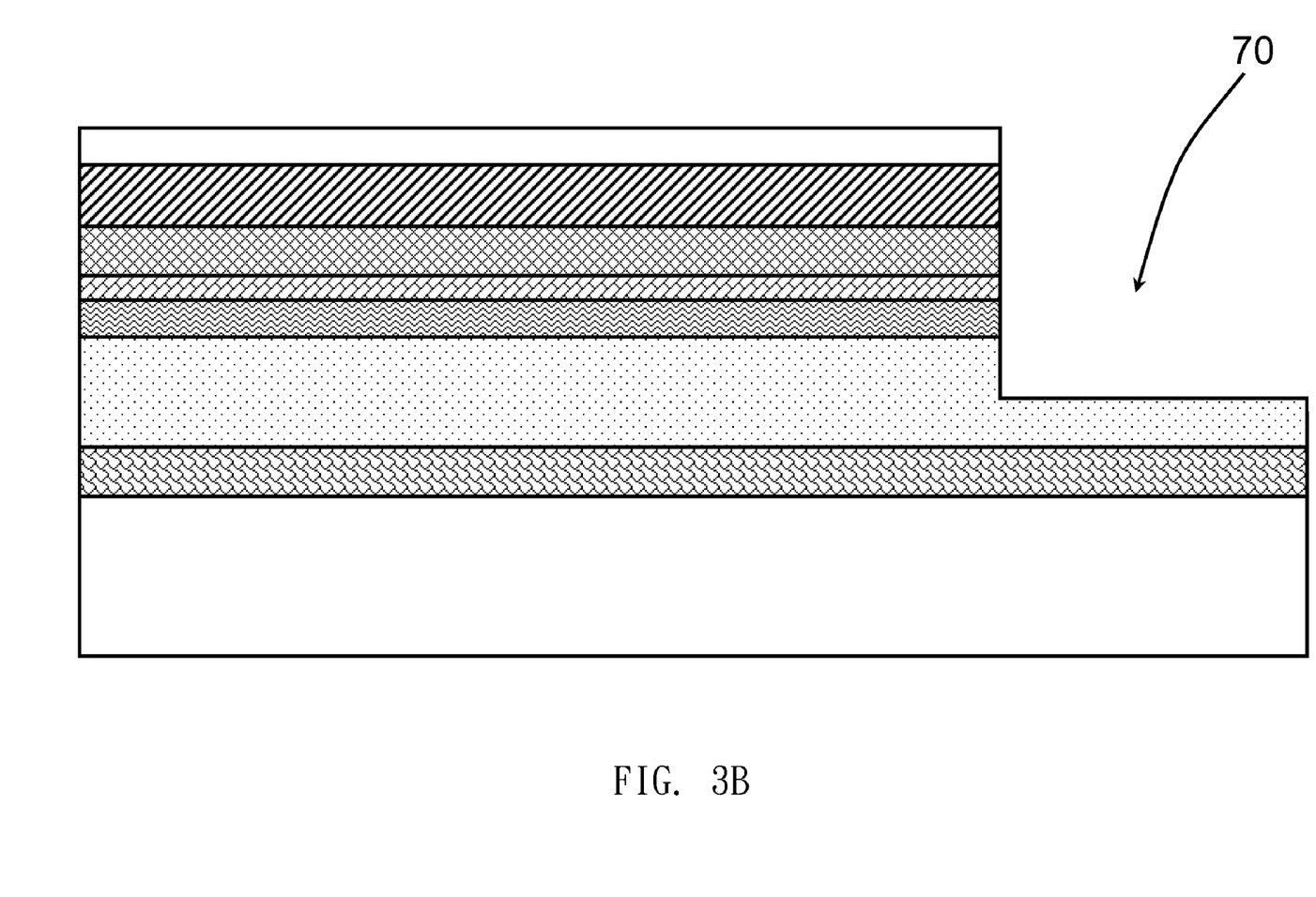
FIG. 3B is a depressed region etched out during chip dicing process according to one embodiment of the present invention.
Figure 3C:
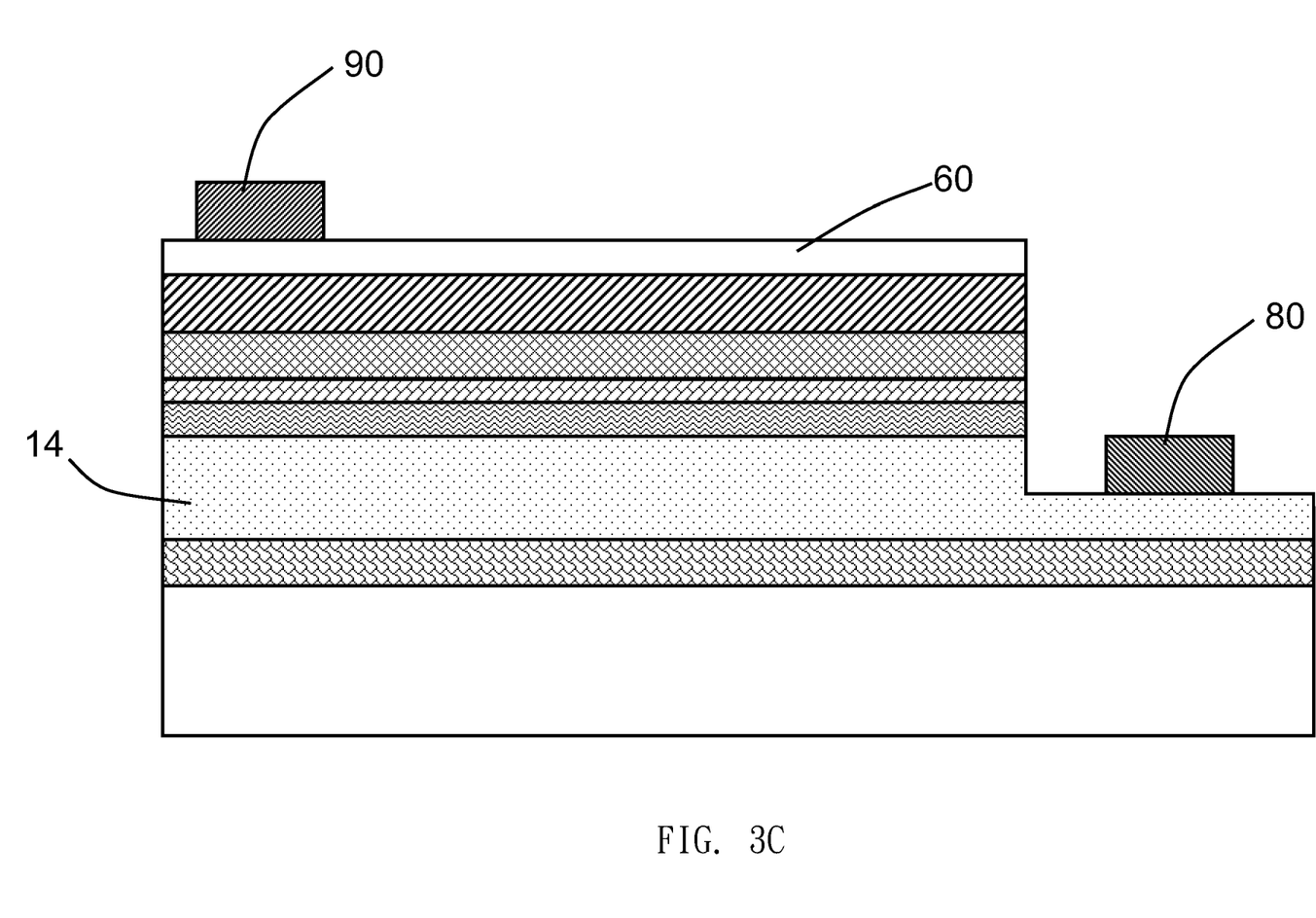
FIG. 3C shows a p-electrode and an n-electrode formed during chip dicing process according to one embodiment of the present invention.

Next, when the epitaxial substrate is a sapphire substrate or a non-conductive substrate, an n-electrode and a p-electrode are formed on the same surface such that a structure with electrodes positioned on the same side of a substrate is formed, as shown in FIG. 3C. In this process step, a portion of the transparent conductive layer 60, the wavelength conversion layer 40, the p-type contact layer (if formed), the p-type cladding layer 20, the active layer 16, the n-type cladding layer 14, and the n-type contact layer (if formed) are removed to form a depressed region 70, as shown in FIG. 3B. The removal of those layers can be achieved by a dry etching process or a wet etching process. As shown in FIG. 3C, a p-electrode 90 is formed on the transparent conductive layer 60, and an n-electrode 80 is formed on the exposed n-type cladding layer 14 or on the n-type contact layer (if formed). The p-electrode 90 and n-electrode 80 can be formed using a physical vapor deposition process such as a vapor deposition process or a sputter deposition process. The p-electrode 90 and n-electrode 80 can be patterned using lithography-etching processes or a lift-off process.

After electrodes are formed, the epitaxial substrate is thinned down by a grinding process. The step is optional, and it is for improving the brightness of the light emitting diode.

Figure 4:
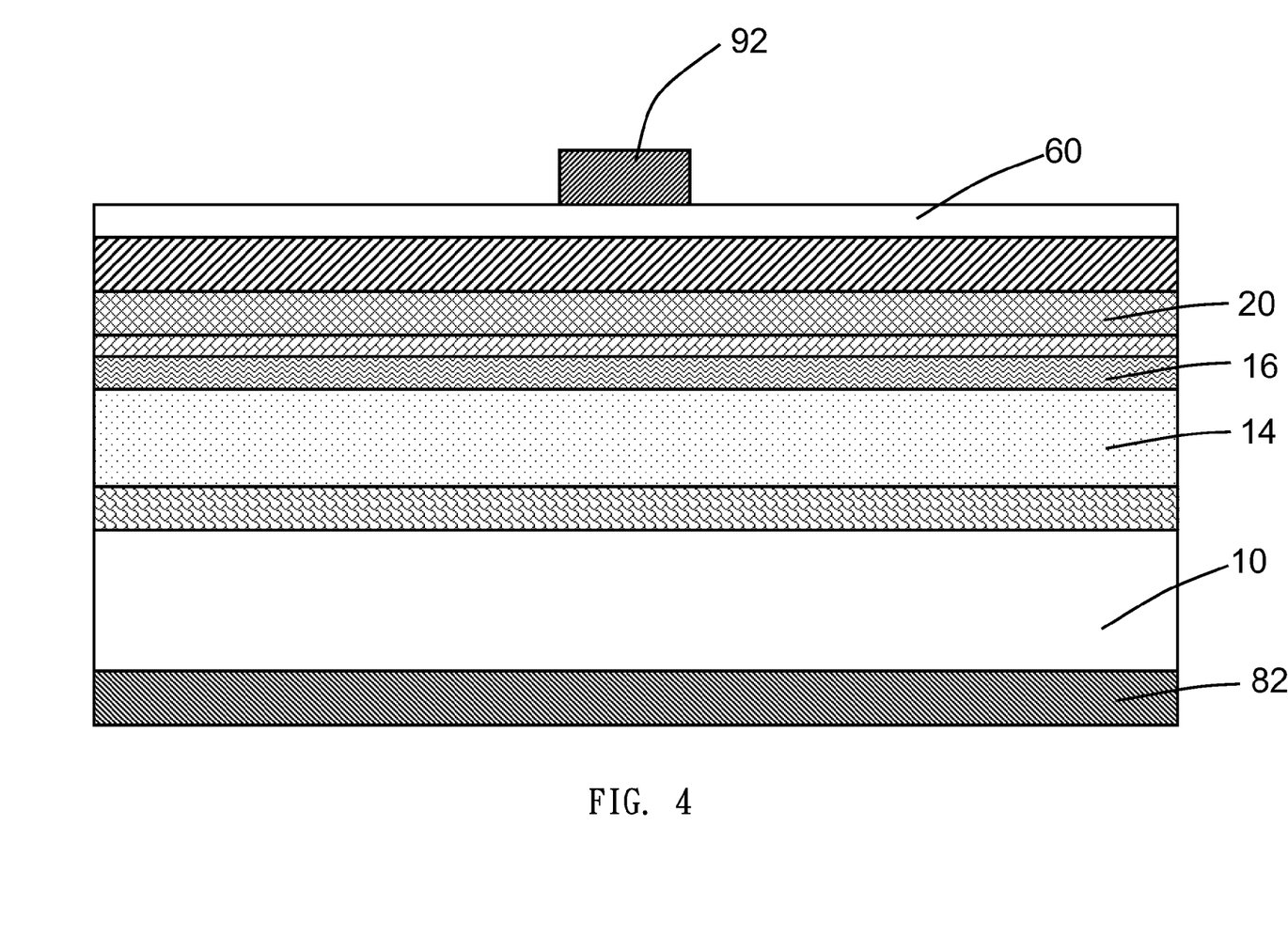
FIG. 4 shows n-electrode formed on the bottom of an epitaxial substrate, which is conductive, according to one embodiment of the present invention.

When the epitaxial substrate 10 is a silicon carbide substrate or a conductive substrate, it is unnecessary to remove a portion of the transparent conductive layer 60, the wavelength conversion layer 40, the p-type contact layer (if formed), the p-type cladding layer 20, the active layer 16, the n-type cladding layer 14, and the n-type contact layer to expose the n-type cladding layer 14 or the n-type contact layer (if formed). As shown in FIG. 4, n-electrode 82 can be directly formed on the bottom of the epitaxial substrate 10, and the p-electrode 92 can be formed close to the central area of the transparent conductive layer 60.

Figure 5A:
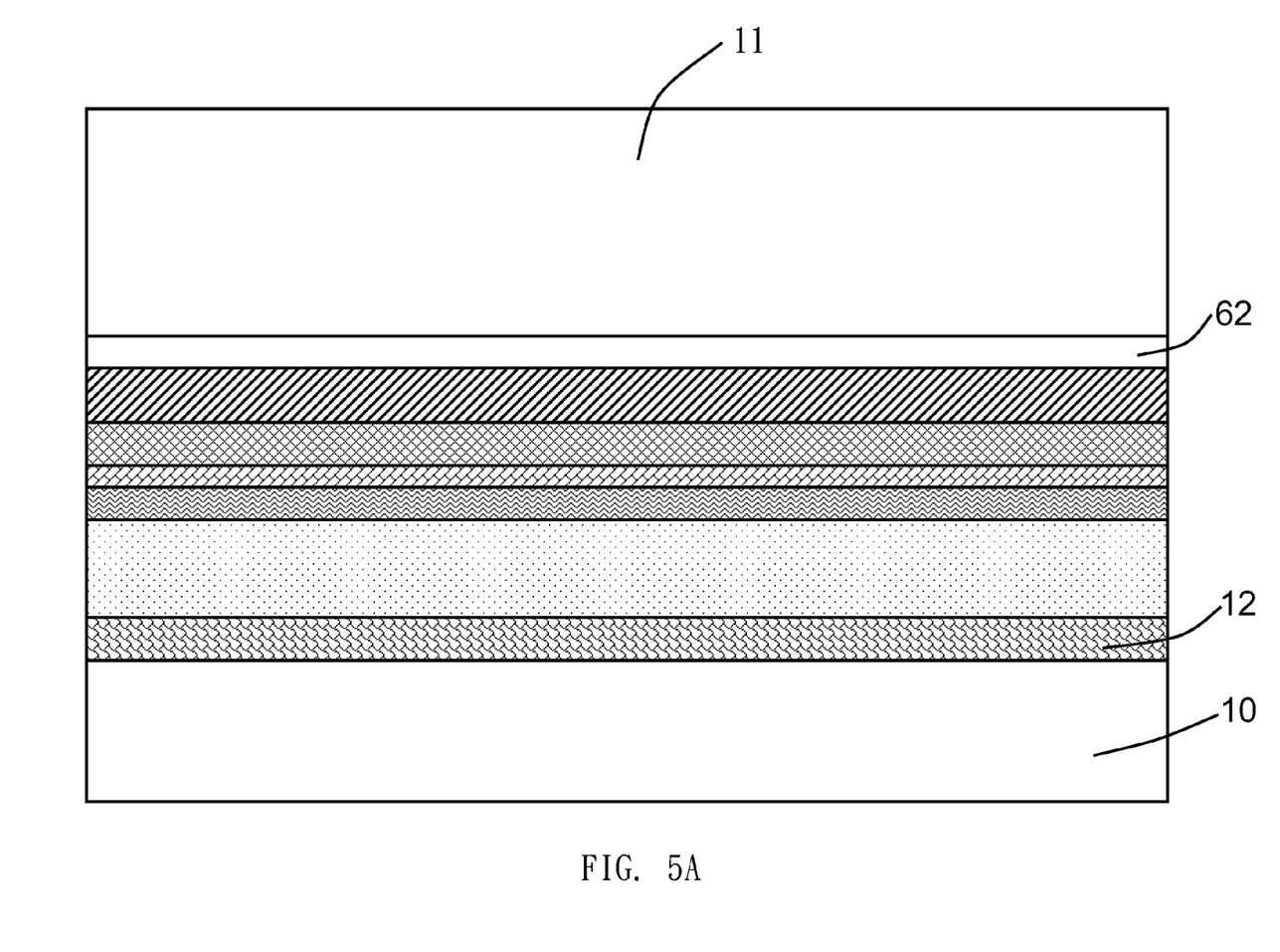
FIG. 5A shows a metal substrate formed during the removal of an epitaxial substrate according to one embodiment of the present invention.
Figure 5B:
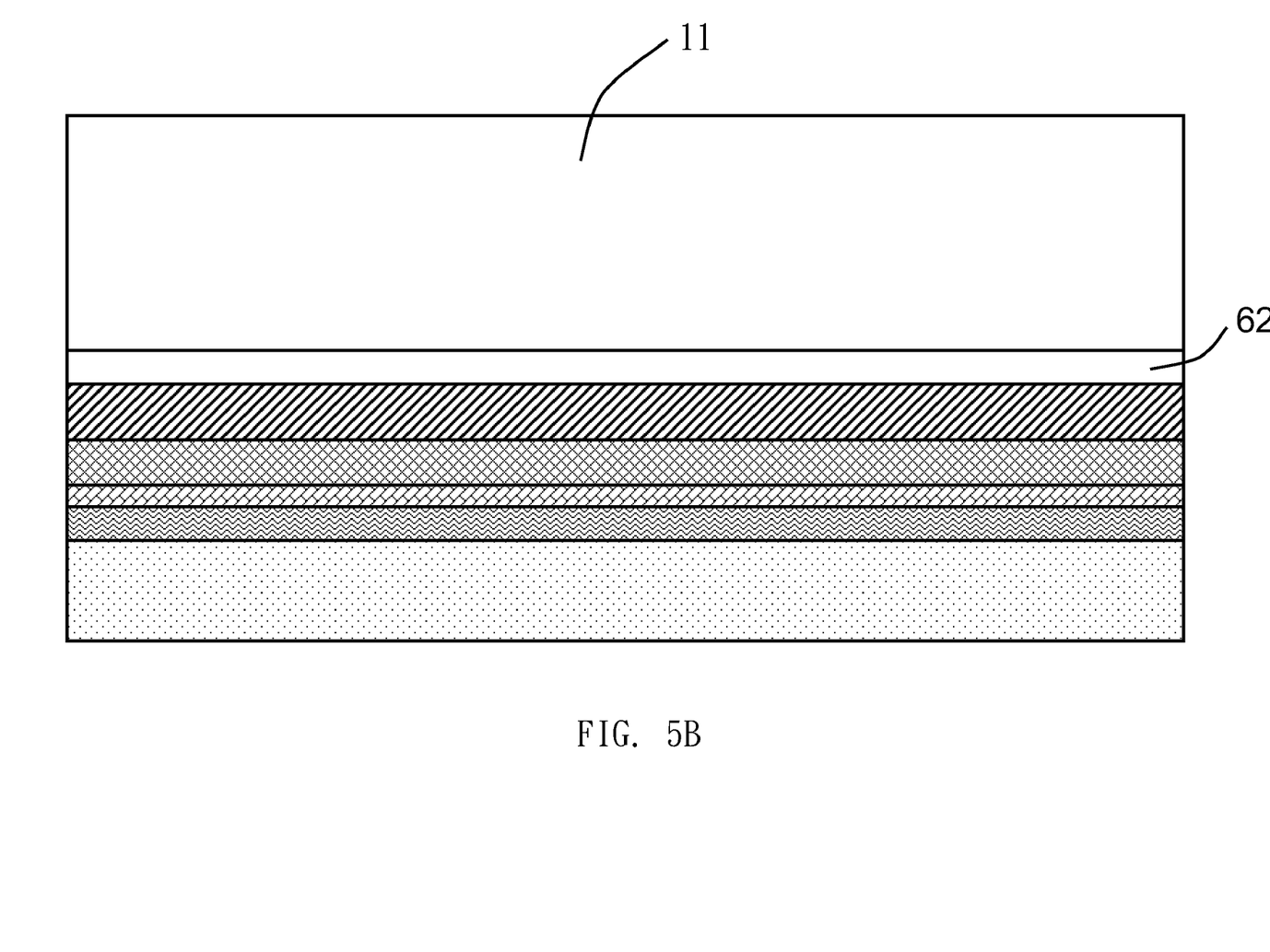
FIG. 5B shows the removal of an epitaxial substrate and a buffer layer in a removal process of epitaxial substrate according to one embodiment of the present invention.
Figure 5C:
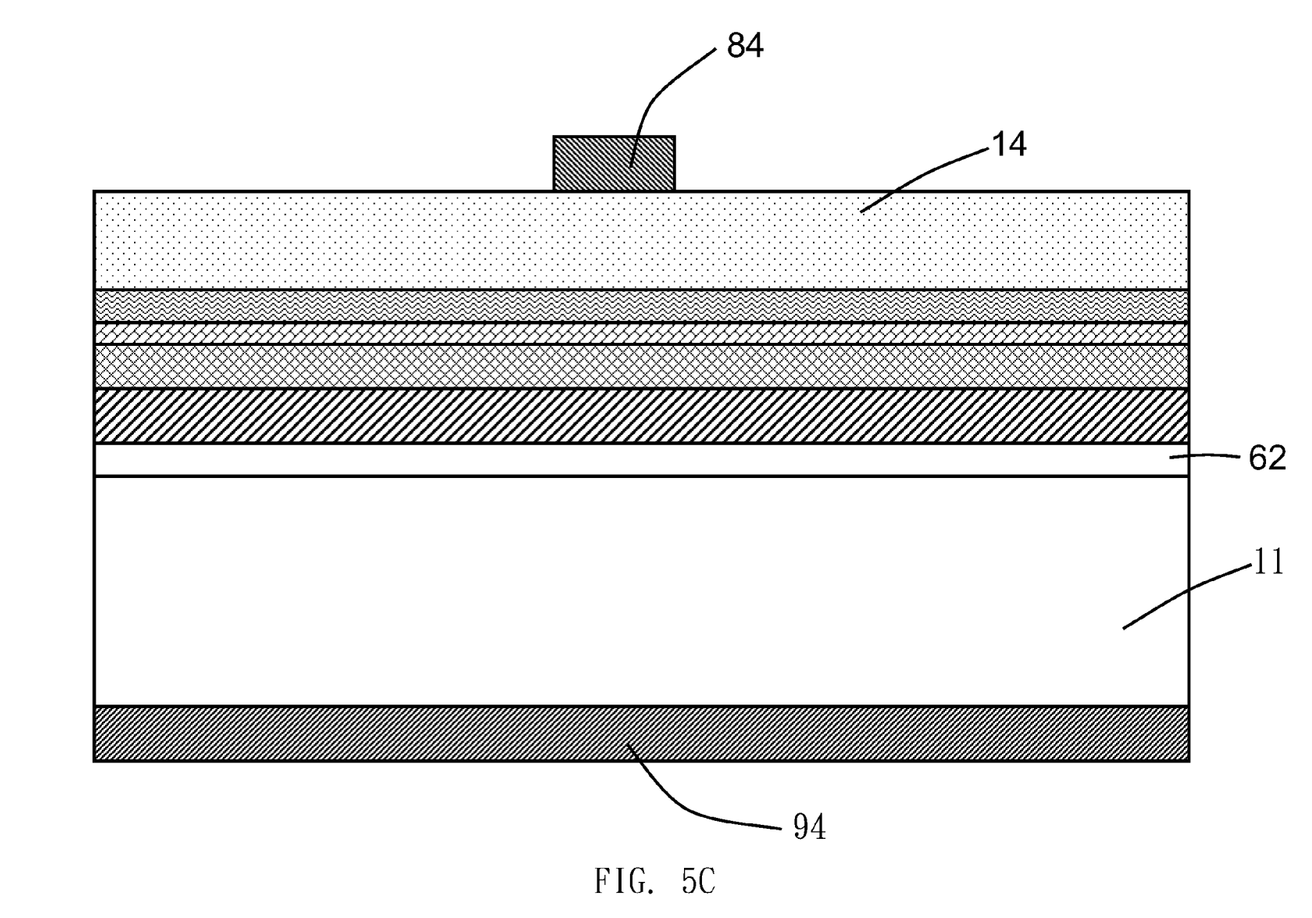
FIG. 5C shows an n-electrode and a p-electrode formed during the removal of an epitaxial substrate process according to one embodiment of the present invention.

Moreover, when the epitaxial substrate 10 is a sapphire substrate, it can be removed by the substrate lift-off technology as shown in FIG. 5. At this moment, a metal substrate 11 should be formed on the opposite surface to provide a support when the substrate 10 is under lift-off stress, as shown in FIG. 5A. If the substrate lift-off technology is adopted, the ohmic contact layer 62 formed following the wavelength conversion layer need not be transparent. The substrate lift-off technology can be a laser lift-off process; or the epitaxial substrate 10 and the buffer layer 12 can be removed using a wet chemical etching process ash shown in FIG. 5B. As shown in FIG. 5C, the wafer is then flipped over to make the n-type cladding layer 14 face upward. A p-electrode 94 is formed on the metal substrate 11, and an n-electrode 84 is formed on the n-type cladding layer 14. A method using a conductive substrate or the substrate lift-off technology can obtain a structure with an n-electrode and a p-electrode formed on two opposite surfaces of the substrate.

Thereafter, the entire wafer is diced to obtain a plurality of dies. The wafer can be diced using a wafer saw or a laser to obtain individual chips or dies. The diced chips or dies are bonded to a die attach film, waiting for the next process.

Figure 6:
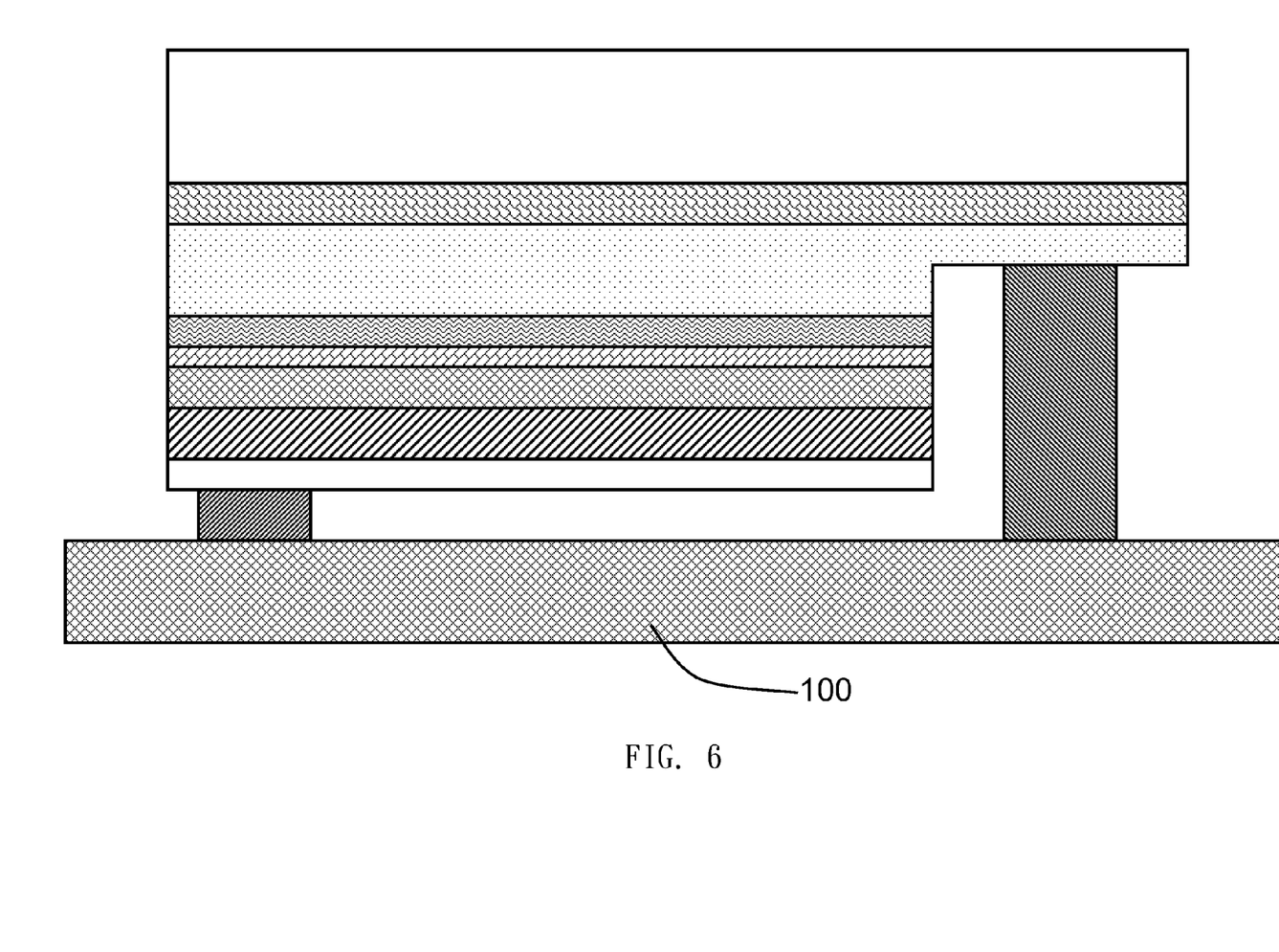
FIG. 6 shows a structure for flip-chip packaging according to one embodiment of the present invention.

Referring to FIG. 6, the present invention may use a flip chip package method for chip packaging. Using the wafer dicing technology only can adopt the structure with electrodes on the same side of a substrate. During chip packaging, the n-electrode and the p-electrode of a chip or a die with electrodes on the same side thereof are directly bonded to a package substrate 100.

The method of the present invention forms at least one wavelength conversion layer on a surface of a light emitting to produce white light or polychromatic light, wherein the wavelength conversion layer is made of semiconductor, which can produce light with any desired wavelength. Moreover, the packaged light emitting diode of the present invention can produce white light without adding any phosphor or can provide white light having good color rendering index (Ra).

In view of the means and effects of the present invention, the present invention has many advantages. First, the wavelength conversion layer can be completely formed in a reactor chamber without using lithography process, reducing the risk of contamination. In addition, compared to prior art technologies, the location of p-n junction would not change so as to remain the original light emission efficiency. Moreover, the wavelength conversion layer is a semiconductor, and therefore, the energy level thereof can be changed according to the requirement of wavelength. Further, the surface of the wavelength conversion layer can be a rough surface, which increases light emission efficiency.

The above-described embodiments of the present invention are intended to be illustrative only. Numerous alternative embodiments may be devised by persons skilled in the art without departing from the scope of the following claims.

What is claimed is:

1. A polychromatic light emitting diode device, comprising:
   a substrate;
   a multiple semiconductor layer formed on said substrate, wherein said multiple semiconductor layer comprises an n-type semiconductor layer, a p-type semiconductor layer and an active layer disposed between said n-type semiconductor layer and said p-type semiconductor layer, and said active layer emits light of a first wavelength;
   a first wavelength conversion layer formed on said multiple semiconductor layer, the first wavelength conversion layer having a plurality of indentations, wherein said first wavelength conversion layer is made of semiconductor and absorbs a portion of said light of a first wavelength emitted from said active layer and emits light of a second wavelength, wherein said second wavelength is longer than said first wavelength; and
   a transparent conductive layer formed on said first wavelength conversion layer, wherein said transparent conductive layer is in direct contact with said multiple semiconductor layer via said plurality of indentations of the first wavelength conversion layer.

2. The polychromatic light emitting diode device of claim 1, wherein the material of said first wavelength conversion layer is a Group III-V semiconductor material or a Group II-VI semiconductor material, wherein said Group III-V semiconductor material is Group III nitride, Group III phosphide or Group III arsenide, and said Group II-VI semiconductor material is Group II oxide, Group II sulfide or Group II selenide.

3. The polychromatic light emitting diode device of claim 2, further comprising a second wavelength conversion layer formed on said first wavelength conversion layer, wherein said second wavelength conversion layer absorbs said light of a first wavelength and said light of a second wavelength from said first wavelength conversion layer and emits light of a third wavelength, and said third wavelength is longer than said second wavelength.

4. The polychromatic light emitting diode device of claim 3, wherein the material of said second wavelength conversion layer is Group III-nitride, Group III phosphide or Group III arsenide.

5. The polychromatic light emitting diode device of claim 2, wherein said substrate is of sapphire, silicon carbide, lithium aluminate, lithium gallate, silicon, gallium nitride, zinc oxide, aluminum zinc oxide, gallium arsenide, gallium phosphide, gallium antimonide, indium phosphide, indium arsenide, zinc selenide or metal.

6. The polychromatic light emitting diode device of claim 5, further comprising a buffer layer between said substrate and said multiple semiconductor layer.

7. The polychromatic light emitting diode device of claim 6, further comprising a p-type electron blocking layer disposed between said active layer and said p-type semiconductor layer.

8. The polychromatic light emitting diode device of claim 1, further comprising a second wavelength conversion layer formed on said first wavelength conversion layer and a third wavelength conversion layer disposed on said second wavelength conversion layer.

9. The polychromatic light emitting diode device of claim 8, wherein said active layer emits ultraviolet light; and said first wavelength conversion layer, said second wavelength conversion layer, and said third wavelength conversion layer separately emit blue light, green light and red light.

* * * * *